US009450004B2

(12) United States Patent
Tu et al.

(10) Patent No.: US 9,450,004 B2
(45) Date of Patent: Sep. 20, 2016

(54) WAFER-LEVEL ENCAPSULATED SEMICONDUCTOR DEVICE, AND METHOD FOR FABRICATING SAME

(71) Applicant: OmniVision Technologies, Inc., Santa Clara, CA (US)

(72) Inventors: Chih-Hung Tu, Hsinchu (TW); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/542,169

(22) Filed: Nov. 14, 2014

(65) Prior Publication Data
US 2016/0141320 A1 May 19, 2016

(51) Int. Cl.
*H01L 27/146* (2006.01)
*H01L 21/82* (2006.01)

(52) U.S. Cl.
CPC ......... *H01L 27/14618* (2013.01); *H01L 21/82* (2013.01); *H01L 27/14627* (2013.01); *H01L 27/14632* (2013.01); *H01L 27/14685* (2013.01); *H01L 27/14687* (2013.01)

(58) Field of Classification Search
None
See application file for complete search history.

(56) References Cited

U.S. PATENT DOCUMENTS

| 6,777,767 B2 | 8/2004 | Badehi |
| 7,378,724 B2 | 5/2008 | Yu et al. |
| 7,528,420 B2 | 5/2009 | Weng et al. |
| 7,569,409 B2 | 8/2009 | Lin et al. |
| 8,569,180 B2 | 10/2013 | Yang |
| 2004/0077121 A1* | 4/2004 | Maeda ............ H01L 27/14618 438/75 |
| 2009/0045441 A1* | 2/2009 | Kweon ............ H01L 27/14618 257/291 |

OTHER PUBLICATIONS

Ceyssens, Frederik, et al., "Deep Etching of Glass Wafers Using Sputtered Molybdenum Masks," Journal of Micromechanics and Microengineering, vol. 19, pp. 1-6, 2009.
Bocko, Peter L., "Glass for Advanced Semiconductor Applications: Myths and Opportunities," Corning, 2011.
Feng, Ru, et al. "Infuenced of Processing Conditions on the Thermal and Mechanical Properties of SU8 Negative Photoresist Coatings," Journal of Micromechnics and Microengineering, vol. 13, 80-88, 2003.
Hoya Corporation, "SD-2—Glass Substrate for Silicon Sensors," http://www.hoyaoptics.com/pdf/silicon_sensor.pdf, accessed Jul. 2014.
Memscyclopedia.Org, "SU-8: Thick Photo-Resist for Mems," http://memscyclopedia.org/su8.html, Jan. 1999.

(Continued)

*Primary Examiner* — Anthony Ho
*Assistant Examiner* — Kevin Quinto
(74) *Attorney, Agent, or Firm* — Lathrop & Gage LLP

(57) ABSTRACT

An encapsulated semiconductor device includes a device die with a semiconductor device fabricated thereon. A carrier layer opposite the device die covers the semiconductor device. A dam supports the carrier layer above the device die, the dam being located therebetween. The semiconductor device further includes a first sealant portion for attaching the dam to the device die, and a means for attaching the dam to the carrier layer. The device die, the dam, and the carrier layer form a sealed cavity enclosing the semiconductor device.

A method of encapsulating semiconductor devices formed on a device wafer includes forming an assembly including a carrier wafer and a plurality of dams thereon. After the step of forming, the method attaches the plurality of dams to the device wafer to form a respective plurality of encapsulated semiconductor devices.

15 Claims, 14 Drawing Sheets

(56) References Cited

OTHER PUBLICATIONS

Nagarah, John, et al. "Ultradeep Fused Silica Glass Etching with an HF-Resistant Photosensitive Resist for Optical Imaging Applications," Journal of Micromechanics and Microengineering, vol. 22, pp. 1-7, 2012.

Niklaus, F., et al., "Applied Physics Review—Focused Review, Adhesive Wafer Bonding," Journal of Applied Physics, 99, 031101, 2006.

Oberhammer, J., "Sealing of Adhesive Bonded Devices on Wafer Level," Department of Signals, Sensors and Systems, Microsystem Technology, Royal Institute of Technologies, pp. 407-412, 2003.

Schott, "Schott MEMpax," Product Information Sheet, Dec. 2013.

Shearn, Michael, et al., "Advanced Plasma Processing: Etching, Deposition, and Wafer Bonding Techniques for Semicaonductor Applications, Semiconductor Technologies" Available from: http://www.intechopen.com/books/semiconductor-technologies/advanced-plasma-processing-etchingdeposition-and-wafer-bonding-techniques-for-semiconductor-applica, Apr. 2010.

Trott, Dr. Gary., et al., "Glass Wafer MechnicalProperties: A Comparison to Silicon," Impact, IEEE Catalog No. CEP11598-USB, 2011.

Hocheng, H., et al., "Innovative Approach to Uniform Imprint of Micron and Submicron Features," Journal of Achievements in Materials and Manufacturing Engineering, vol. 28, Issue 1, May 2008.

* cited by examiner

WAFER-LEVEL ENCAPSULATED SEMICONDUCTOR DEVICE, AND METHOD FOR FABRICATING SAME

FIELD OF THE INVENTION

This disclosure relates to wafer-level chip scale packaging of semiconductor devices, and particularly, the encapsulation of complementary metal-oxide-semiconductor (CMOS) image sensors on a device wafer.

BACKGROUND

Wafer-level chip-scale (WL-CS) packaging of cameras manufactured with CMOS technologies has contributed to the incorporation of cameras in high-volume consumer products such as mobile devices and motor vehicles. Such a camera includes a CMOS image sensor having a pixel array, wherein each pixel includes a microlens that focuses light on it. Contaminates incident on a microlens can adhere to it and render the associated pixel inoperable. Thus, one function of a WL-CS package is to isolate each CMOS image sensor on a wafer from said contaminates. Wafer-level packaging cannot contact the microlenses, for risk of damaging them, and the packaging must be optically transparent so as not to filter the light incident on the CMOS image sensor.

FIG. 1 depicts a carrier wafer 124 above a device wafer 122 that includes an array of dies 101 that each include a semiconductor device thereon. In the embodiment of FIG. 1, the semiconductor device is a CMOS image sensor that includes a microlens array 100. Device wafer 122 may be formed of silicon, silicon-germanium, silicon carbide, or similar materials used in the art. Carrier wafer 124 is part of a WL-CS package and may be formed of glass, plastic, or any material that does not impede the operation of the semiconductor devices on dies 101. In the embodiment of FIG. 1, carrier wafer 124 is optically transparent so as not to significantly filter light reaching microlens array 100.

Dicing an assembly that includes device wafer 122 encapsulated by carrier wafer 124 results in WL-CS packaged image sensors, such as a prior-art WL-CS packaged image sensor 290 of FIG. 2. FIG. 2 is a cross-sectional view of WL-CS packaged image sensor 290 disclosed in U.S. Pat. No. 6,777,767 to Badehi. A microlens array 207 is mounted on a substrate 202, which is connected to conductive pads 212. Conductive pads 212 are electrically connected to electrical contacts 208, which are electrically connected to a conducting bump 210. An epoxy 204 bonds substrate 202 to a bottom packaging layer 206. Spacer elements 216 separate a glass packaging layer 224 from microlens array 207, creating a microlens-array cavity 220. An epoxy sealant 218 seals cavity 220, which has a cavity height 221. In the direction of cavity height 221, epoxy sealant 218 bridges cavity 220 between packaging layer 224 and electrical contacts 208, and between packaging layer 224 and substrate 202.

A limitation with WL-CS packaged image sensor 290 is that the coefficient of thermal expansion (CTE) of conductive pads 212, spacer elements 216, and epoxy sealant 218 are sufficiently disparate that delamination can occur should temperature change during fabrication, for example, during the surface mounting process. U.S. Pat. No. 7,528,420 to Weng et al. addresses this limitation by applying recesses into a carrier wafer 324, illustrated in FIG. 3. Carrier wafer 324 is bonded to a device wafer 322. Carrier wafer 324 includes recesses 316 that result in microlens cavities 320 that each enclose a respective microlens array 307. Recesses 316 are photolithographically etched into carrier wafer 324. Each microlens cavity 320 has a cavity height 321.

SUMMARY OF THE INVENTION

An encapsulated semiconductor device includes a device die with a semiconductor device fabricated thereon. A carrier layer opposite the device die covers the semiconductor device. A dam supports the carrier layer above the device die, the dam being located therebetween. The encapsulated semiconductor device further includes a first sealant portion for attaching the dam to the device die, and a means for attaching the dam to the carrier layer. The device die, the dam, and the carrier layer form a sealed cavity enclosing the semiconductor device. Neither the first sealant portion, nor the means for attaching the dam to the carrier layer, nor a combination thereof, independently bridge a gap between the device die and the carrier layer.

A method of encapsulating semiconductor devices formed on a device wafer includes forming an assembly including a carrier wafer and a plurality of dams thereon. After the step of forming, the method attaches the plurality of dams to the device wafer to form a respective plurality of encapsulated semiconductor devices.

DETAILED DESCRIPTION

Figure 1:
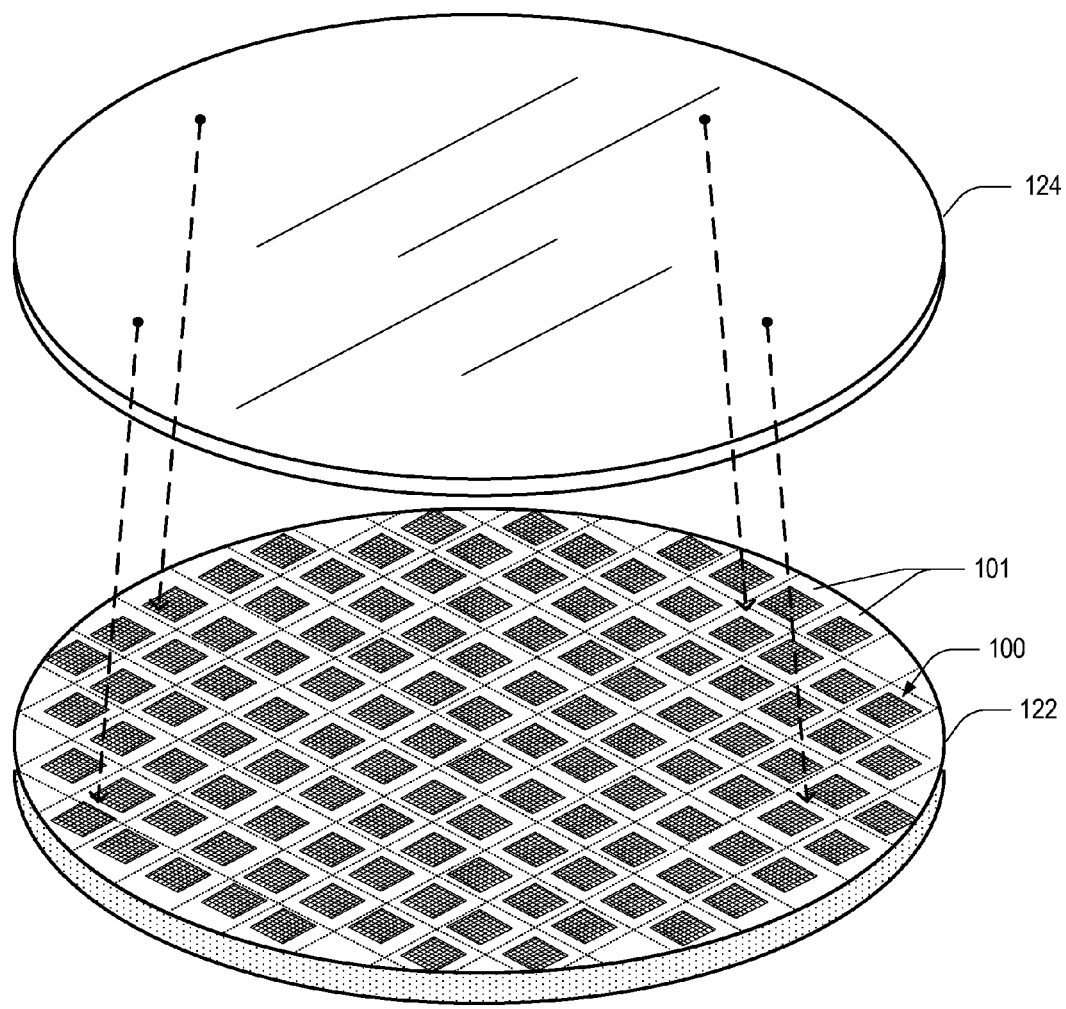
FIG. 1 depicts a carrier wafer above a device wafer that includes an array of dies, each die including a semiconductor device.

A drawback of microlens cavities 320 is that etching carrier wafer 324 with both desired anisotropy and optical quality light-transmitting surfaces (e.g., surfaces 336) requires a dry etching process, which has a relatively slow etch rate.

Limited cavity height is a second drawback of prior-art microlens cavities such as microlens cavity 320. The height of microlens cavity 320 is limited by the thickness of carrier wafer 324. For example, of Schott's MEMpax® glass wafer products, the largest standard thickness is 700 μm. Moreover, increasing cavity height 321, e.g., by increasing etch depth into carrier wafer 324, increases both production costs and difficulty of achieving acceptable etch uniformity. The ability to fabricate cavities with heights ranging from approximately 200 μm to 800 μm can improve image sensor performance by enabling placement of microlens array 307 precisely at the focal plane of a camera imaging lens axially aligned thereto.

This disclosure presents encapsulated semiconductor devices and associated methods, that potentially lack delamination problems associated with mismatched CTEs, described above. These devices and methods also help maintain both chemical resistance and carrier wafer optical quality, while providing larger cavity heights.

Figure 4:
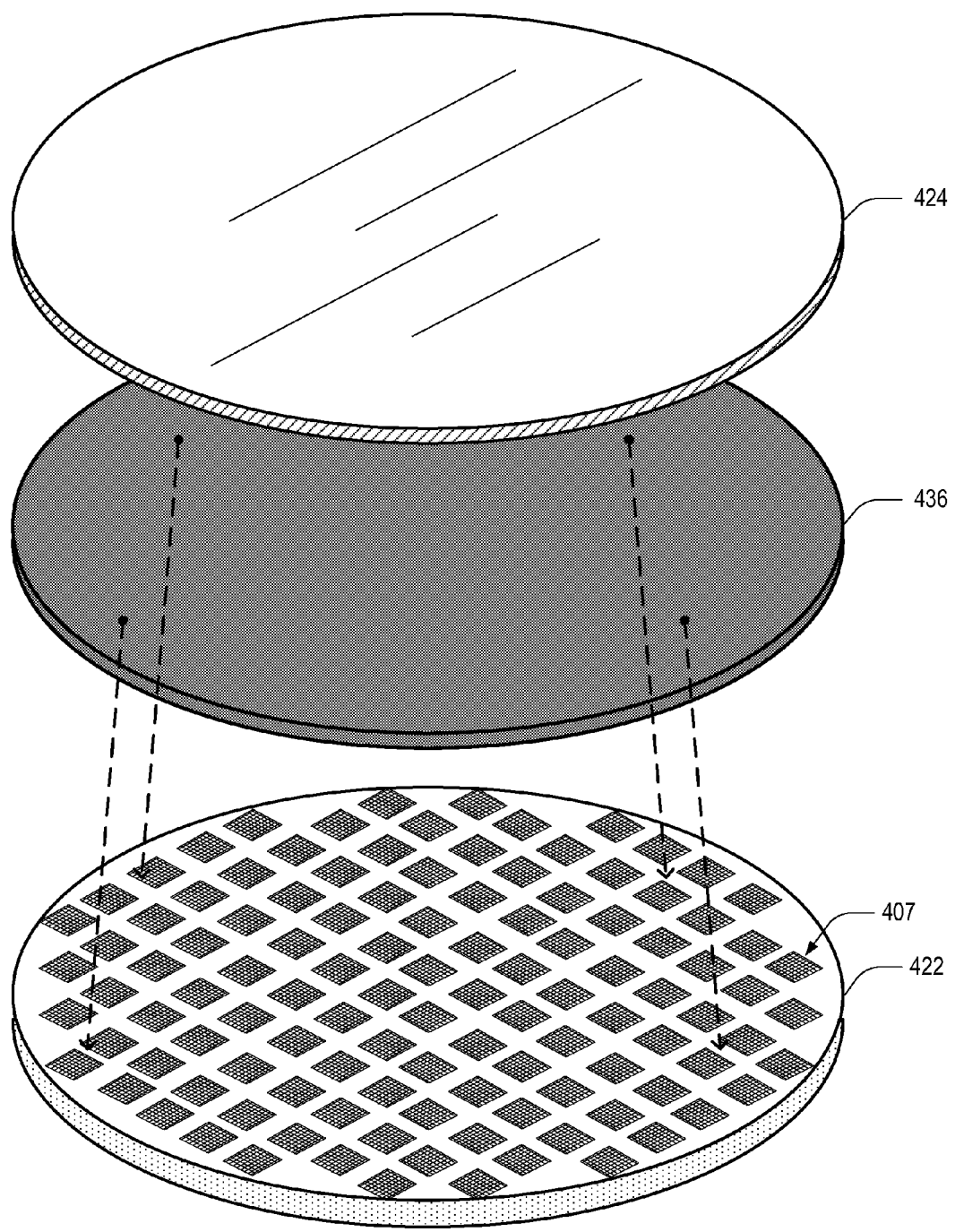
FIG. 4 is a perspective view of a spacer wafer between carrier wafer and a device wafer with an array of CMOS image sensors formed thereon, in an embodiment.

FIG. 4 is a perspective view of a spacer wafer 436 between a carrier wafer 424 and a device wafer 422 with an array of CMOS image sensors formed thereon. Each CMOS image sensor includes a microlens array 407. Carrier wafer 424 and device wafer 422 are similar to carrier wafer 124 and device wafer 122, respectively, of FIG. 1.

Carrier wafer 424 may be formed of a glass with a coefficient of thermal expansion (CTE) engineered to match silicon. Such glasses include Corning® Semiconductor Glass Wafers by Corning, Inc. (Corning, N.Y., USA), SD-2 substrates by Hoya Corporation (Santa Clara, Calif., USA), and MEMpax® by Schott A G (Mainz, Germany). Between 150° C. and 450° C., the CTE of these materials is approximately 3.5 ppm/K. The relative difference between the CTE of these materials and silicon is less than 15% of the CTE of silicon.

Figure 2:
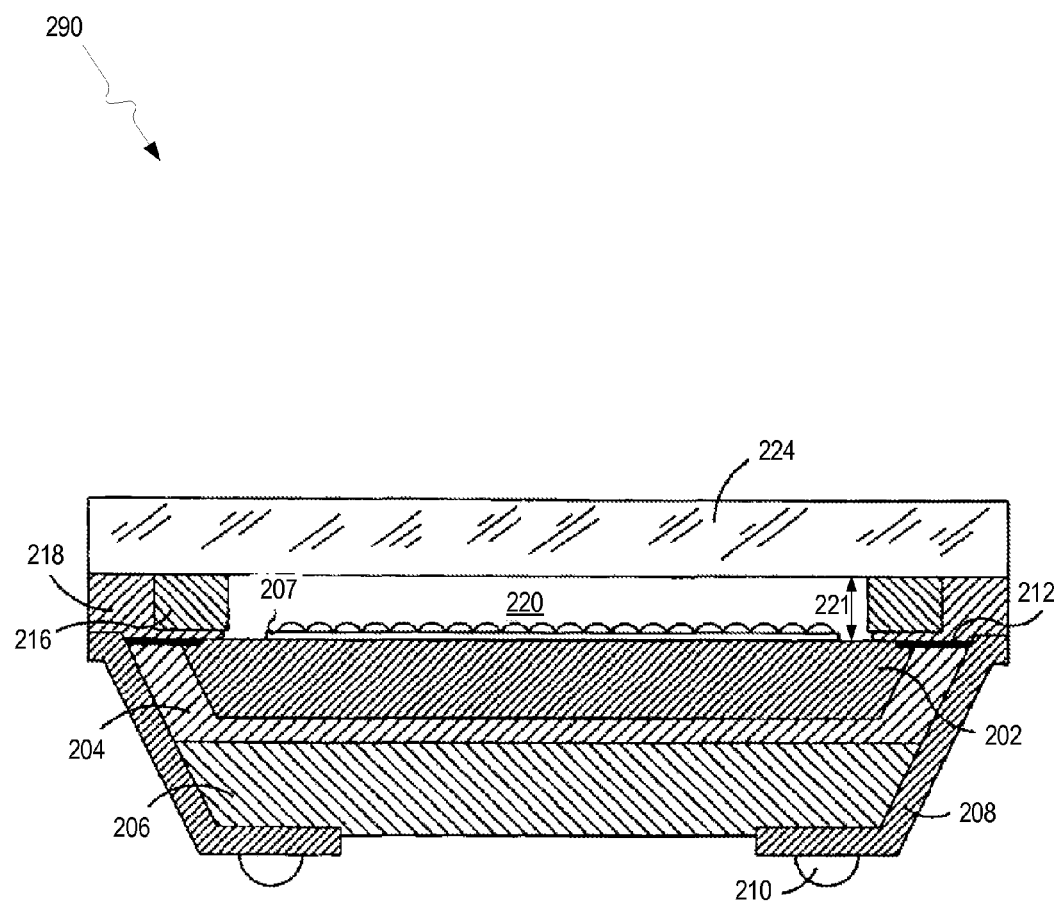
FIG. 2 is a cross-sectional view of a first prior-art WL-CS packaged image sensor.
Figure 3:
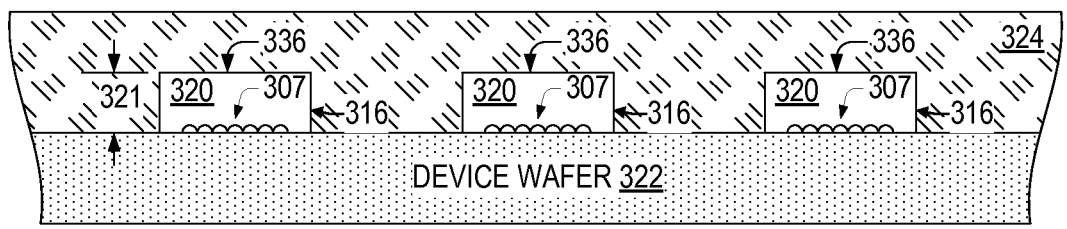
FIG. 3 is a cross-sectional view of a second prior-art WL-CS packaged image sensor.

In methods disclosed herein, spacer wafer 436 are processed to form parts of cavities analogous to cavities 220 (FIGS. 2) and 320 (FIG. 3). To avoid the delamination risk associated with WL-CS packaged image sensor 290, candidate materials for spacer wafer 436 include silicon, glass, or other materials used in the art having a CTE that substantially matches the CTE of one or both of carrier wafer 424 and device wafer 422 at temperatures between 20° C. and 450° C. Herein, "substantially matching" or "substantially equal" means that the relative difference between the CTE of one material and a reference material (e.g, silicon) is less than 15% of the reference material's CTE at temperatures between 20° C. and 450° C.

The requirement that the CTE of spacer wafer 436 substantially matches that of one or both of the carrier wafer 424 and the device wafer 422, as described above, disqualifies at least some photoresist materials as candidate materials for spacer wafer 436. For example MicroChem Corp. quotes its SU-8 photoresist as having a CTE of 52 ppm/K, which is more than ten times that of the aforementioned commercial glasses with CTEs engineered to match silicon.

Figure 5:
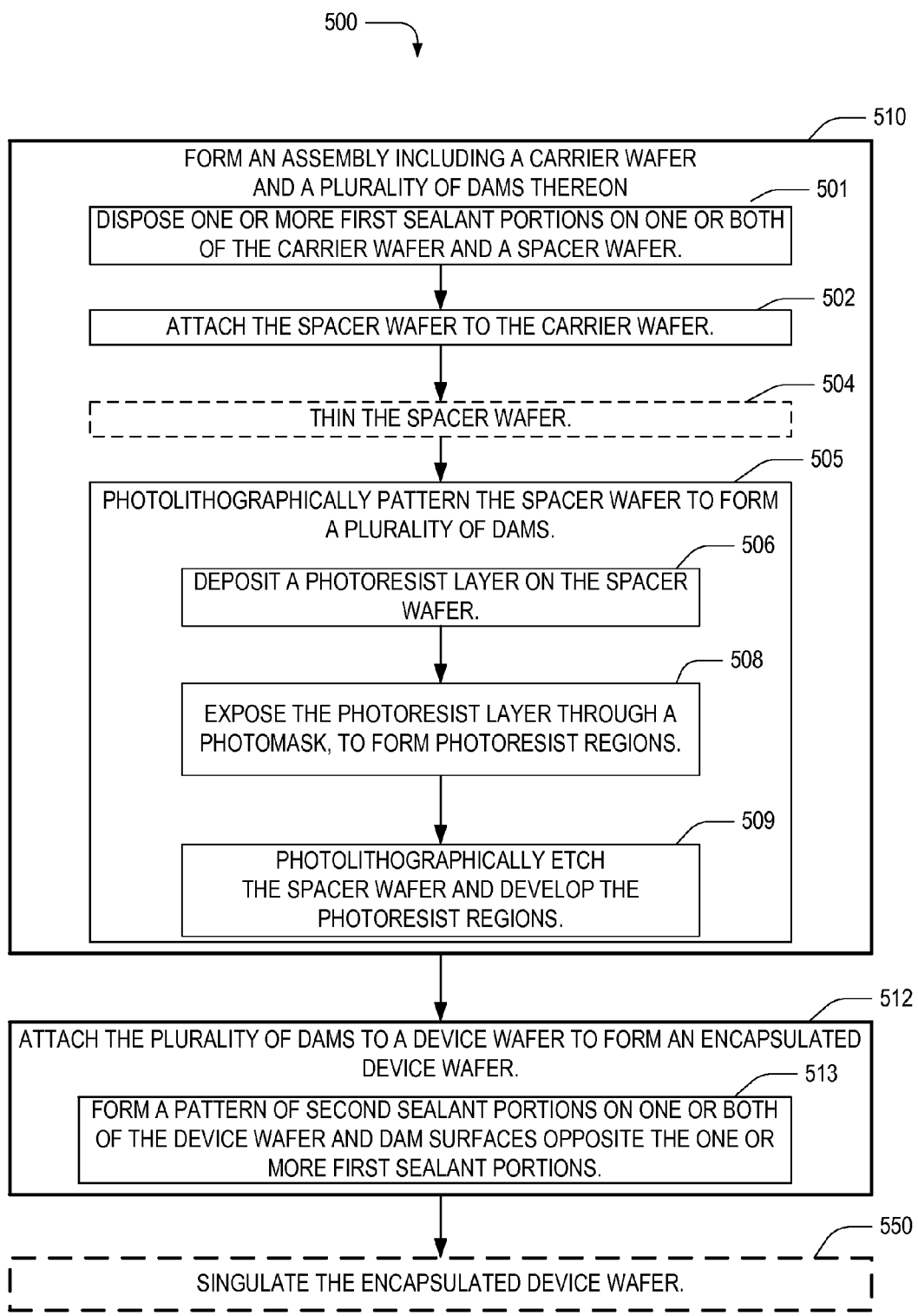
FIG. 5 is a flowchart illustrating a first method for wafer-level encapsulation of a semiconductor device, in an embodiment.
Figure 6:
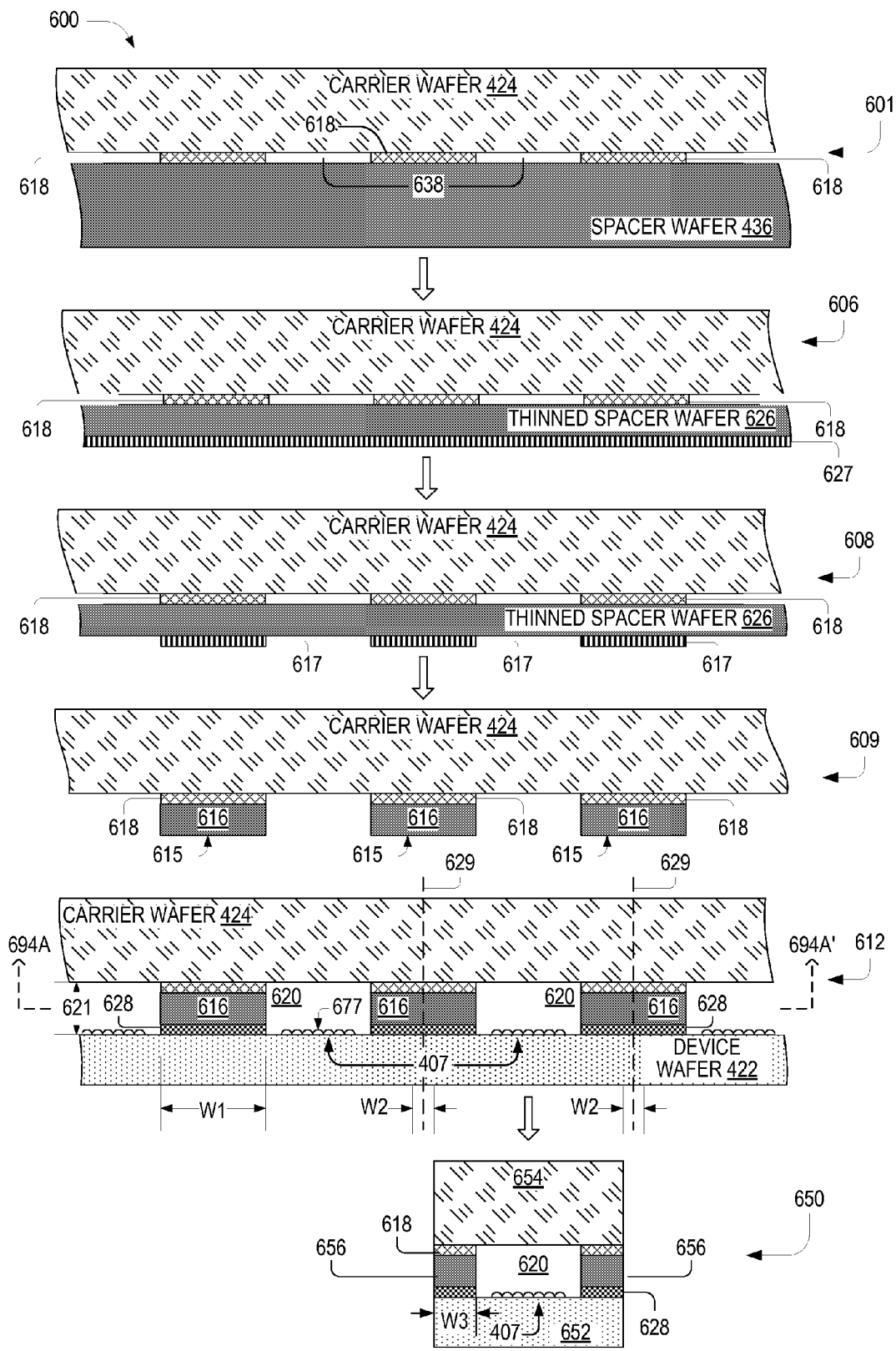
FIG. 6 shows cross-sectional views of wafer-level encapsulation of a CMOS image sensor, the views corresponding to steps of the method shown in FIG. 5, in an embodiment.

FIG. 5 is a flowchart illustrating an exemplary method 500 for wafer-level encapsulation of a semiconductor device. The cross-sectional views of FIG. 6 show wafer-level encapsulation of a semiconductor device, a CMOS image sensor, the views corresponding to steps of method 500. FIG. 5 and FIG. 6 are best viewed together with the following description.

In step 510, method 500 forms an assembly including a carrier wafer and a plurality of dams thereon. In an embodiment of method 500, step 510 includes steps 501, 502, 504, and 505.

In step 501, method 500 disposes one or more first sealant portions on one or both of the carrier wafer and a spacer wafer. In an example of step 501, method 500 forms a plurality of first sealant portions 618 on spacer wafer 436, as shown in cross-sectional view 601, FIG. 6. In a second example of step 501, method 500 forms a plurality of first sealant portions 618 on carrier wafer 424. In a third example of step 501, method 500 forms a first sealant portion 618 on spacer wafer 436 and a first sealant portion 618 on carrier wafer 424. First sealant portions 618 may be one continuous portion of sealant material, wherein, for example, the sealant material forms a grid pattern.

First sealant portions 618 may be applied via a screen printing method, a roller method, a glue printing method, or other methods known in the art of adhesive wafer bonding. Candidates for first sealant portions 618 include World Rock 8700 series (Kyoritsu Chemical & Co., Ltd., Tokyo, Japan) and EMCAST 1748-S (Electronic Materials, Inc., Breckenridge, Colo., USA). First sealant portions 618 may be formed of a material other than the material of spacer wafer 436.

In step 502, method 500 attaches the spacer wafer to the carrier wafer. In an example of step 502, method 500 bonds carrier wafer 424 to spacer wafer 436 with first sealant portions 618, as shown in cross-sectional view 601, FIG. 6.

In optional step 504, method 500 thins the spacer wafer. Thinning the spacer wafer enables precise control of the heights of dams formed in step 510. Thinning techniques include, but are not limited to mechanical grinding, chemical mechanical polishing, wet etching and dry chemical etching. In an example of step 504, method 500 thins spacer wafer 436 to yield a thinned spacer wafer 626, shown in cross-sectional view 606.

In step 505, method 500 photolithographically patterns the spacer wafer to form a plurality of dams. In an embodiment of method 500, step 505 includes steps 506, 508, and 509.

In step 506, method 500 deposits a photoresist layer on the thinned spacer wafer. In an example of step 506, method 500 deposits a photoresist layer 627 on thinned spacer wafer 626, as shown in cross-sectional view 606. Photoresist layer 627 may be a positive photoresist or a negative photoresist, as known in the art.

In step 508, method 500 exposes the photoresist layer through a photomask to yield a plurality of photoresist regions. In an example of step 508, method 500 exposes photoresist layer 627 through a photomask to yield a plurality of photoresist regions 617, as shown in cross-sectional view 608.

In step 509, method 500 etches the spacer wafer and develops the photoresist regions to form the plurality of dams. In an example of step 509, method 500 etches thinned spacer wafer 626 to form a plurality of shared-wall dams 616 and removes photoresist regions 617 from shared-wall dams 616, as shown in cross-sectional view 609. The etching of step 509 may be a deep-reactive-ion etching process, or other processes known in the art capable of large etch depths.

In step 512, method 500 attaches the plurality of dams to a device wafer, the device wafer including a plurality of dies with semiconductor devices formed thereon, to form an encapsulated device wafer with cavities around each semiconductor device. In an example of step 512, method 500 bonds shared-wall dams 616 to device wafer 422 with second sealant portions 628, to form sealed cavities 620 around respective microlens arrays 407, as shown in an encapsulated wafer assembly 612. Sealed cavities 620 have a cavity height 621. Carrier wafer 424 is aligned with device wafer 422 such that each shared-wall dam 616 is between a pair of adjacent microlens arrays 407.

Step 512 of method 500 may include step 513. In step 513, method 500 forms one or more second sealant portions on one or both of the device wafer and dam surfaces opposite the one or more first sealant portions. In an example of step 513, method 500 forms one or more second sealant portions 628 on dam surfaces 615 opposite first sealant portions 618. In an example of step 513, method 500 forms one or more second sealant portions 628 on device wafer 422. Second sealant portions 628 may be one continuous portion of sealant material, wherein, for example, the sealant material forms a grid pattern.

In step 501, first sealant portions 618 are positioned on carrier wafer 424 such that when carrier wafer 424 is aligned over device wafer 422, no parts of first sealant portions 618 are above a microlens array 407, as shown in encapsulated wafer assembly 612. Otherwise, first sealant portion 618 would refract the light incident on a microlens array 407, which would result in a distorted image thereon.

In an embodiment of encapsulated wafer assembly 612, no intervening solid material, such as a passivation layer, is between a microlens array 407 and carrier wafer 424. Rather, a top surface 677 of the microlens array 407 is a boundary between a sealed cavity 620 and the microlens array 407 therein.

Second sealant portions 628 are similar to first sealant portions 618, and hence have the same candidate materials. In encapsulated wafer assembly 612, no single element bridges sealed cavity 620 between carrier wafer 424 and device wafer 422 in the direction of cavity height 621. For example, neither first sealant portion 618, nor second sealant portion 628, nor a combination consisting of only sealant portions 618 and 628 bridges sealed cavity 620 between carrier wafer 424 and device wafer 422. This lack of bridging by either or both sealant limits the effect of thermal expansion of sealant portions 618 and 628 on the integrity of sealed cavity 620. Instead, a combination of sealant portion 618, shared-wall dam 616, and sealant portion 628 bridges sealed cavity 620 between carrier wafer 424 and device wafer 422.

In optional step 550, method 500 singulates (dices) the encapsulated device wafer to form a plurality of encapsulated semiconductor devices. In an example of step 550, method 500 singulates encapsulated wafer assembly 612 along scribe lines 629 to form an encapsulated semiconductor device 650. Encapsulated semiconductor device 650 includes a device die 652, dams 656, and a carrier layer 654, which are singulated portions of device wafer 422, shared-wall dams 616, and carrier wafer 424, respectively.

The dicing cuts along encapsulated wafer assembly 612 have a dice kerf W2. Shared-wall dams 616 have a width W1, and the width of dams 656 is W3=(W1−W2)/2. To ensure robustness of sealed cavity 620, W3 should exceed 20 µm.

Figure 7:
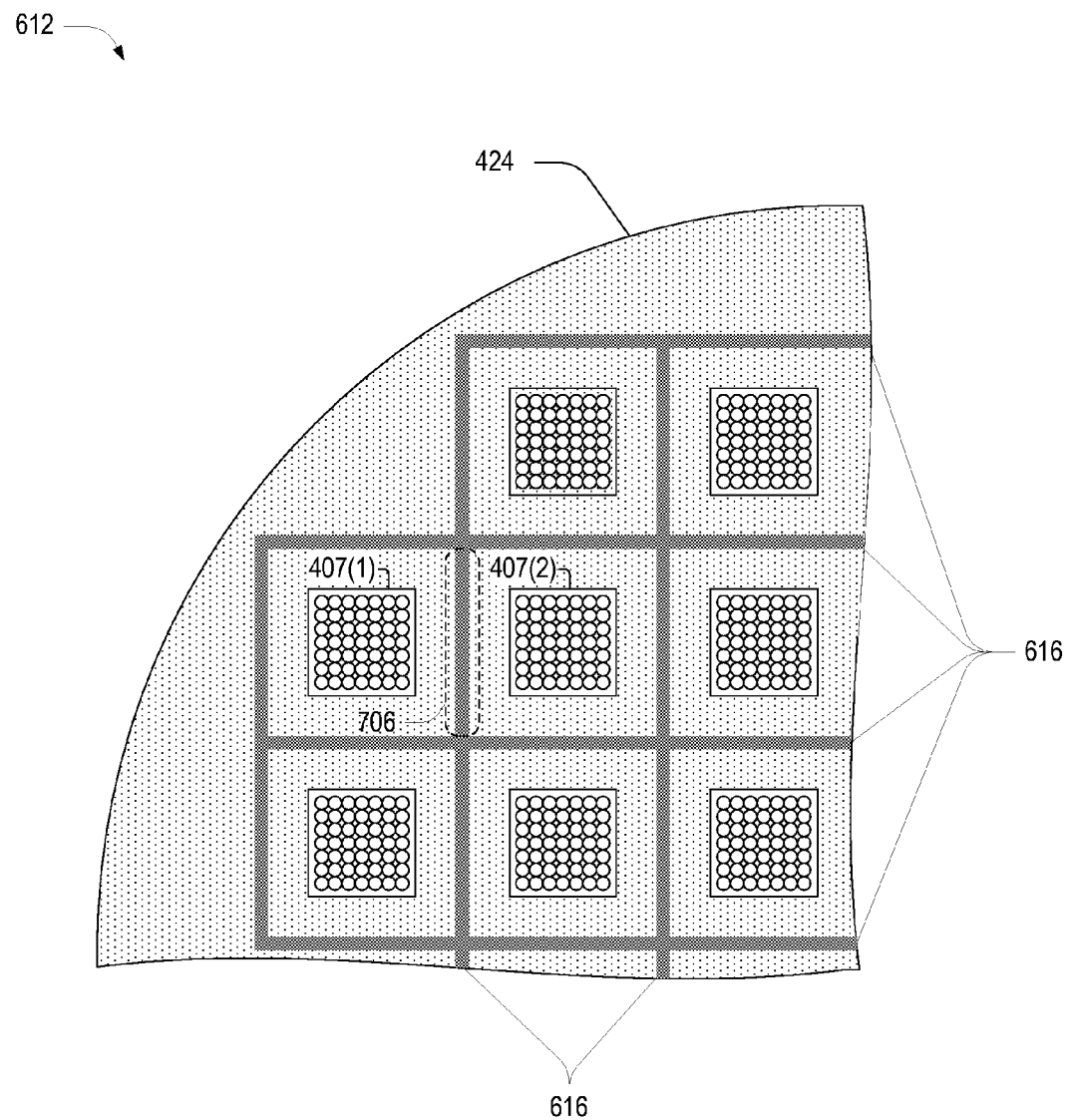
FIG. 7 is a plan view of shared-wall dams mounted on a carrier wafer, in an embodiment.

FIG. 7 is a plan view of encapsulated wafer assembly 612 along a cross-section 694A-694A', FIG. 6, with carrier wafer 424 omitted for clarity. Shared-wall dams 616 form a rectangular array on carrier wafer 424, such that one, and only one, shared-wall dam segment is between two adjacent microlens arrays. For example, a shared-wall dam segment 706, is between two adjacent microlens arrays 407(1) and 407(2).

Figure 8:
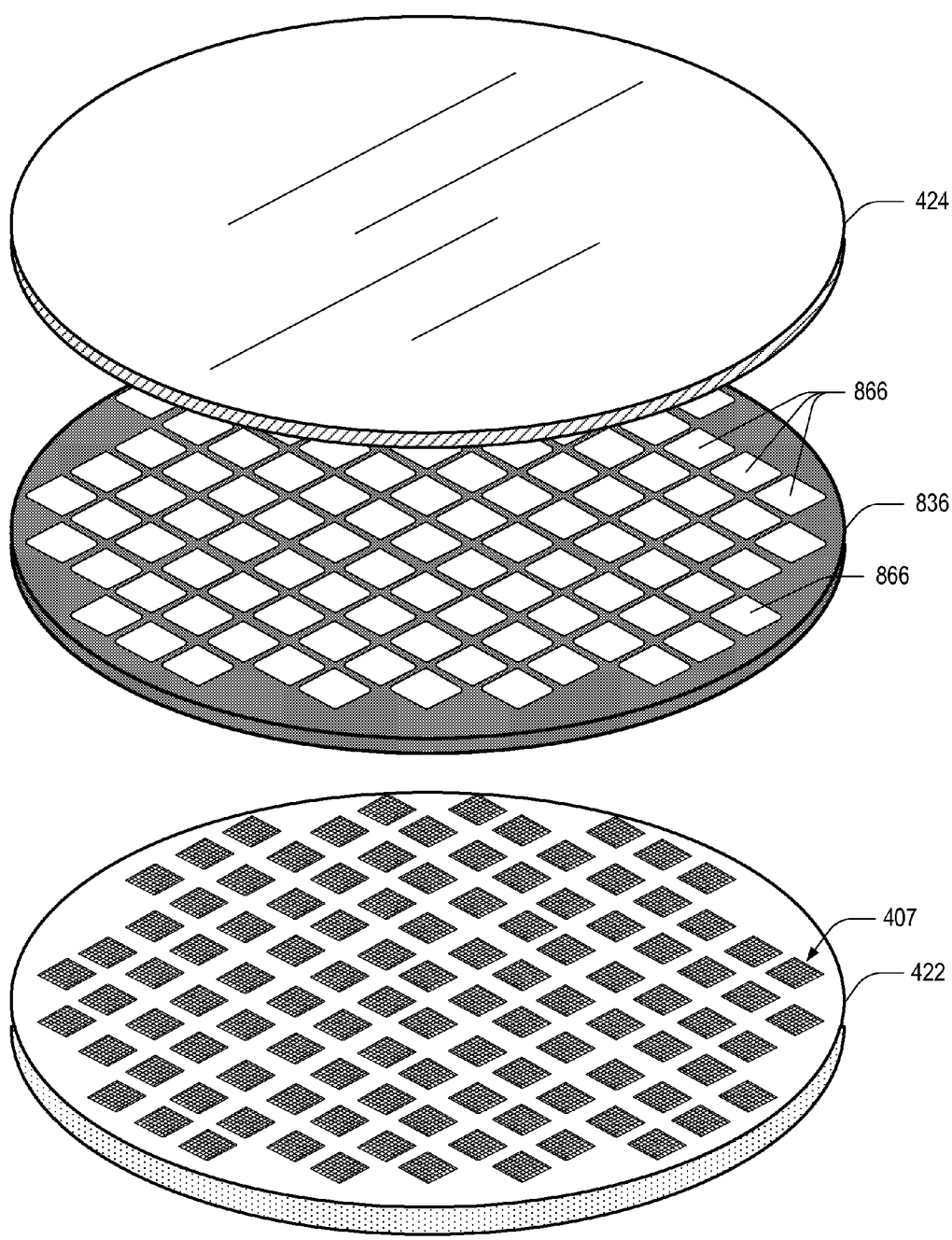
FIG. 8. is a perspective view of an apertured spacer wafer between carrier wafer and a device wafer with an array of CMOS image sensors formed thereon, in an embodiment.

A more direct way of forming shared-wall dams 616 mounted on carrier wafer 424 is to first form an apertured spacer wafer 836 shown in FIG. 8. FIG. 8 is identical to FIG. 4, except that apertured spacer wafer 836 replaces spacer wafer 436. Apertured spacer wafer 836 includes a plurality of apertures 866, of which only some are labeled for clarity of illustration. Apertured spacer wafer 836 may be formed of the same candidate materials as spacer wafer 436 discussed herein.

Figure 9:
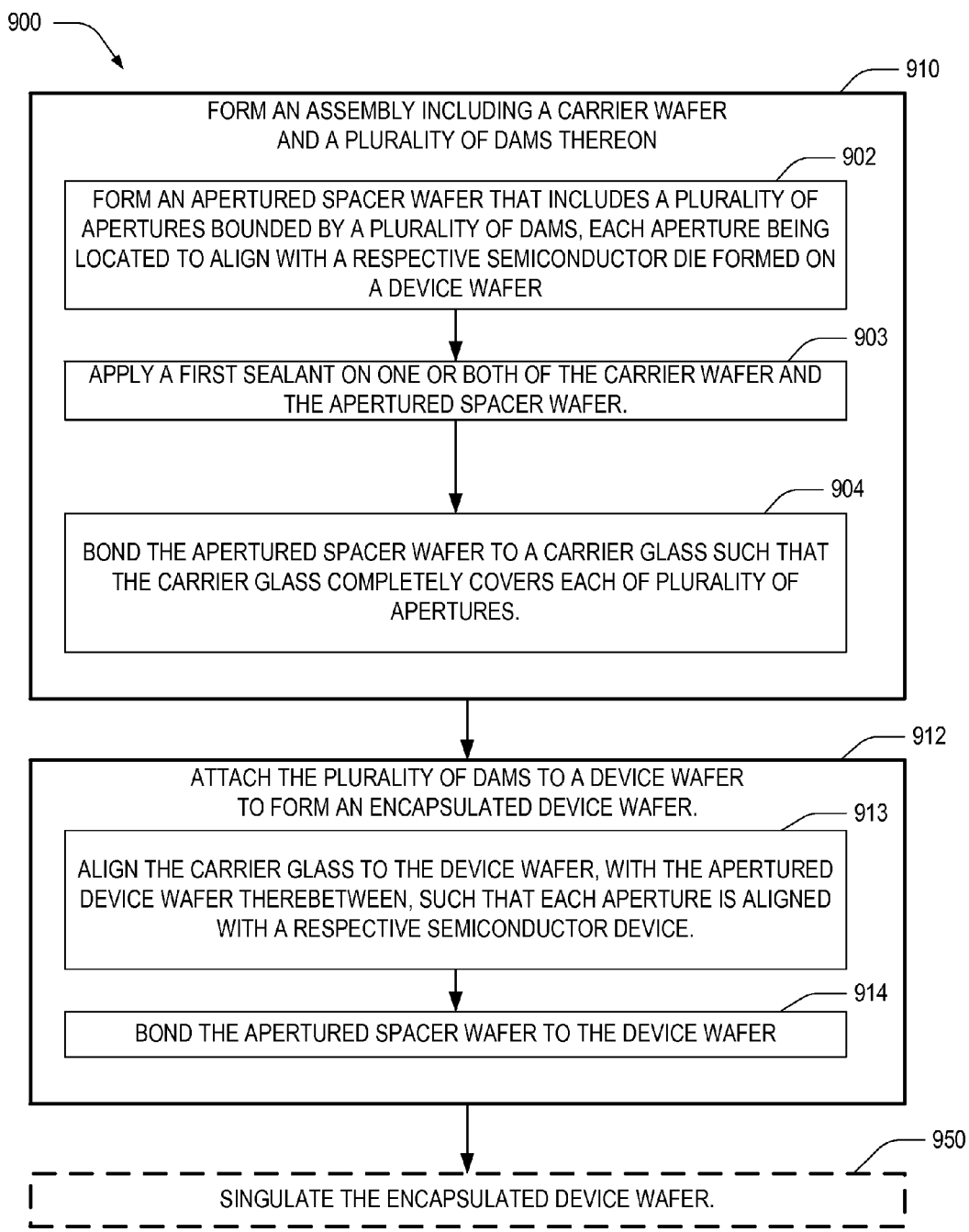
FIG. 9 is a flowchart illustrating a second method for wafer-level encapsulation of a semiconductor device, in an embodiment.

FIG. 9 is a flowchart illustrating an exemplary method 900 for using an apertured spacer wafer to form a wafer-level encapsulated semiconductor device. In step 910, method 900 forms an assembly including a carrier wafer and a plurality of dams thereon. In this respect step 910 resembles step 510 of method 500. Step 910 differs from step 510 by virtue of the means of forming dams. In an embodiment of method 900, step 910 includes steps 902, 903, and 904

In step 902, method 900 forms an apertured spacer wafer that includes a plurality of apertures bounded by a plurality of dams, each aperture being located to align with a respective semiconductor die formed on a device wafer. In an example of step 902, method 900 forms apertured spacer wafer 836 that includes apertures 866 formed at locations corresponding to respective locations of microlens arrays 407, each microlens array 407 being part of a respective semiconductor device formed on device wafer 422.

In step 903, method 900 applies a first sealant on one or both of the carrier wafer and the apertured spacer wafer. Step 903 may employ a screen printing method, a roller method, a glue printing method, or other methods known in the art of adhesive wafer bonding. In an example of step 903, method 900 applies a first sealant on one carrier wafer 424. In a second example of step 903, method 900 applies a first sealant on apertured spacer wafer 836. In a third example of step 903, method 900 applies a first sealant on one carrier wafer 424 and applies a first sealant on apertured spacer wafer 836.

In step 904, method 900 bonds the apertured spacer wafer to a carrier wafer such that the carrier wafer completely covers each of plurality of apertures. In an example of step 904, method 900 bonds apertured spacer wafer 836 wafer to carrier wafer 424 such that the carrier wafer 424 completely covers each aperture 866. Cross-sectional view 609 of FIG. 6 illustrates a result of step 904 where the step of bonding employs first sealant portions 618, and shared-wall dams 616 are part of apertured spacer wafer 836.

In step 912, method 900 attaches the plurality of dams to a device wafer to form an encapsulated device wafer. In an example of method 900, step 912 includes step 913. In step 913, method 900 aligns the carrier wafer to the device wafer, with the apertured spacer wafer therebetween, such that each aperture is aligned with a respective semiconductor device. In an example step 913, method 900 aligns carrier wafer 424 to device wafer 422, with apertured spacer wafer 836 therebetween, such that each aperture 866 is aligned to a respective microlens array 407, each microlens array 407 being part of a respective semiconductor device formed on device wafer 422.

In an example of method 900, step 912 includes step 914, which bonds the apertured spacer wafer to the device wafer. In an example of step 914, method 900 bonds apertured spacer wafer 836 to device wafer 422. Encapsulated wafer assembly 612 of FIG. 6 illustrates a result of step 914 where the bonding employs second sealant portions 628. In method 900, step 912 and optional step 950 follow step 910.

Figure 10:
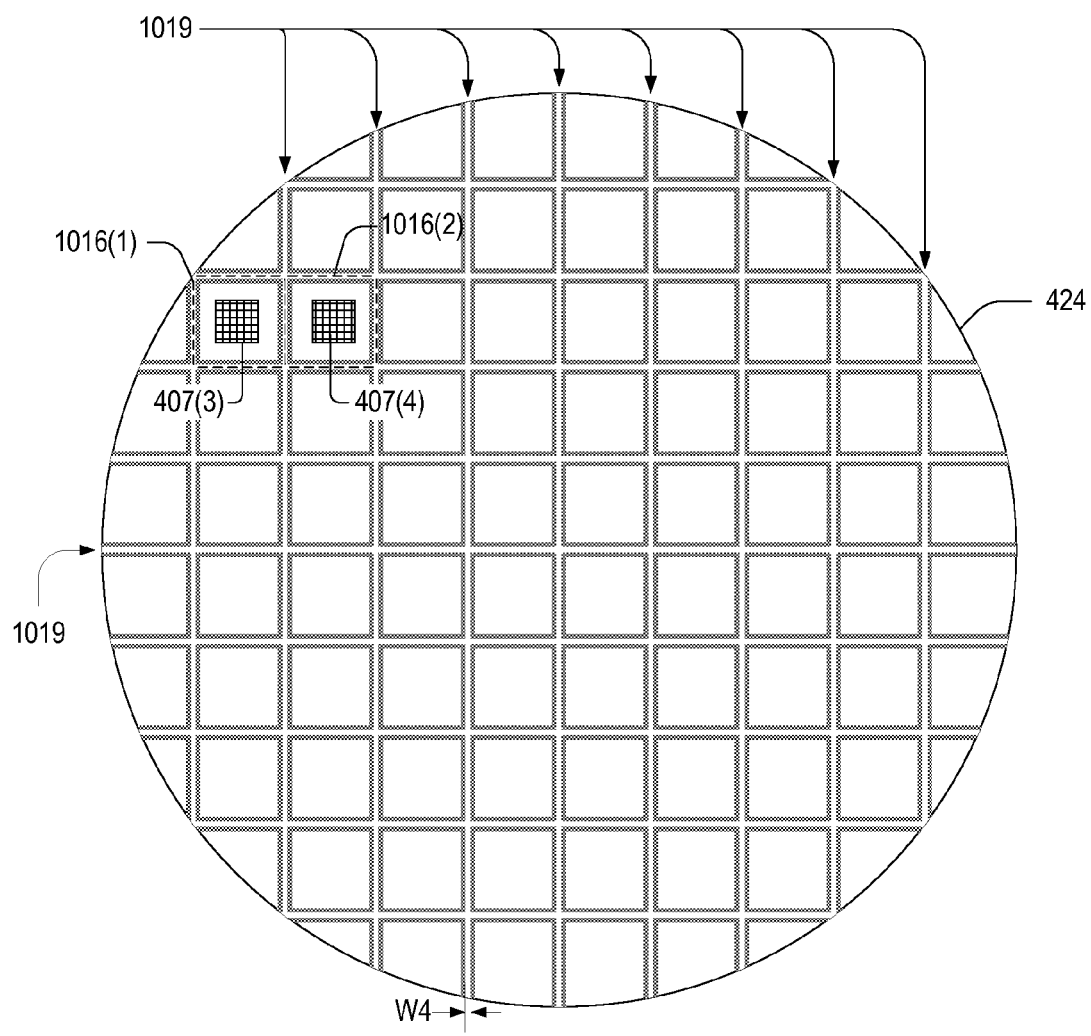
FIG. 10 is a plan view of dedicated-wall dams mounted on a carrier wafer, in an embodiment.

FIG. 10 is a plan view of dedicated-wall dams 1016 mounted on carrier wafer 424. Each dedicated-wall dam 1016 is a closed shape that surrounds a CMOS image sensor that includes a microlens array 407. For example, dedicated-wall dam 1016(1) is rectangular and encloses a microlens array 407(3), and dedicated-wall dam 1016(2) is rectangular and encloses a microlens array 407(4). The regions between adjacent dedicated-wall dams 1016 form an array of vertical and horizontal channels 1019 on carrier wafer 424. Channels 1019 have a width W4. For sake of clarity, not all reference numerals for horizontal channels 1019 are shown in FIG. 10.

A difference between a wafer with only shared-wall dams and a wafer with only dedicated-wall dams is the number of dam segments between adjacent microlens arrays on the wafer. As noted regarding the shared-wall dams 616 of FIG. 7, one and only one shared-wall dam segment is between adjacent microlens arrays 407. FIG. 10 shows more than one dedicated-wall dam segment between two adjacent microlens arrays. For example, portions of both dedicated-wall dam 1016(1) and 1016(2) are between adjacent microlens arrays 407(1) and 400(2).

Figure 11:
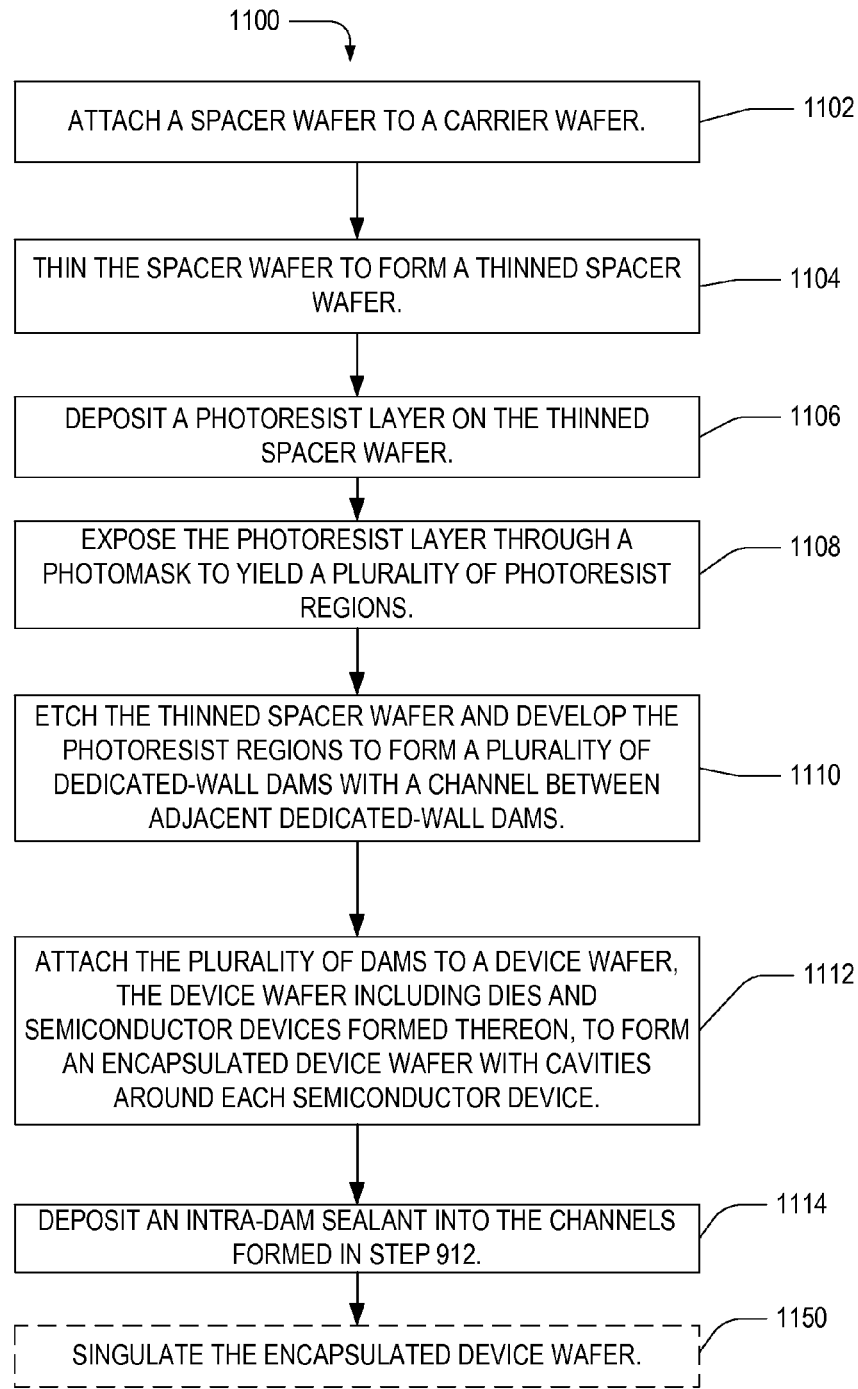
FIG. 11 is a flowchart illustrating a method for wafer-level encapsulation of a semiconductor device using dedicated-wall dams, in an embodiment.
Figure 12:
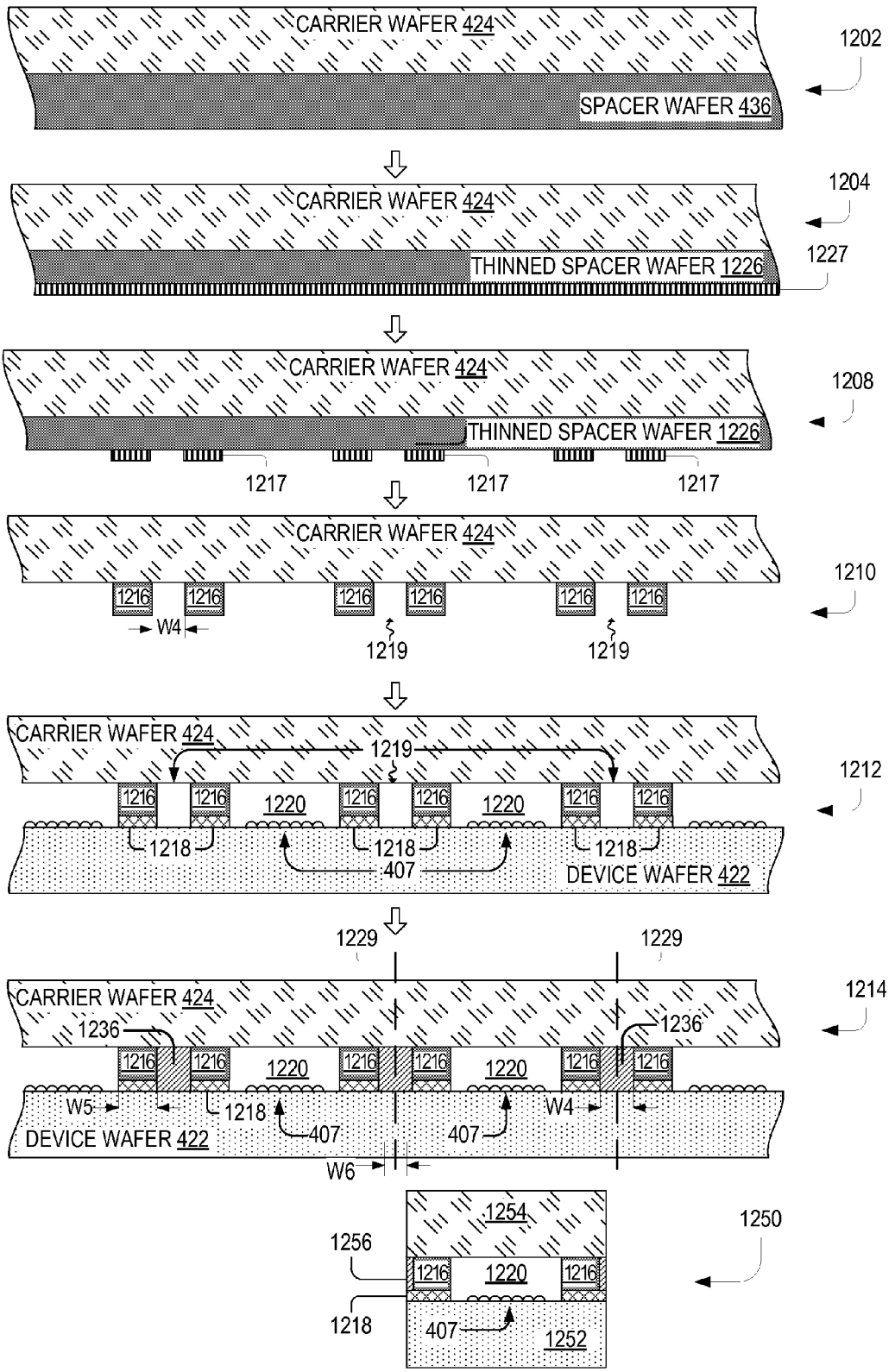
FIG. 12 shows cross-sectional views of wafer-level encapsulation of microlens arrays, the views corresponding to steps of the method shown in FIG. 11, in an embodiment.

FIG. 11 is a flowchart illustrating an exemplary method 1100 for wafer-level encapsulation of a semiconductor device using dedicated-wall dams. FIG. 12 shows cross-sectional views of wafer-level encapsulation of microlens arrays, the views corresponding to steps of method 1100. In FIG. 12 the semiconductor device is a CMOS image sensor. FIG. 11 and FIG. 12 are best viewed together with the following description.

In step 1102, method 1100 attaches a spacer wafer to a carrier wafer. In an example of step 1102, method 1100 attaches spacer wafer 436 to carrier wafer 424 by hard curing, as shown in a cross-sectional view 1202, FIG. 12. Spacer wafer 436 may be formed of a photoresist.

Step 1104 of method 1100 is identical to step 504 of method 500. In an example of step 1104, method 1100 thins spacer wafer 436 to yield a thinned spacer wafer 1226, as shown in a cross-sectional view 1204.

In step 1106, method 1100 deposits a photoresist layer on the thinned spacer wafer. In an example of step 1106, method 1100 deposits a photoresist layer 1227 on thinned spacer wafer 1226, as shown in cross-sectional view 1204. Photoresist layer 1227 may be a positive photoresist or a negative photoresist, as known in the art.

In step 1108, method 1100 exposes the photoresist layer through a photomask to yield a plurality of photoresist regions. In an example of step 1108, method 1100 exposes photoresist layer 1227 through a photomask to yield a plurality of photoresist regions 1217, as shown in a cross-sectional view 1208.

In step 1110, method 1100 etches the thinned dam spacer layer and removes photoresist regions to form a plurality of dedicated-wall dams with a channel between adjacent dedicated-wall dams. In an example of step 1110, method 1100 etches thinned spacer wafer 1226 to form a plurality of dedicated-wall dams 1216, channels 1219, and removes photoresist regions 1217 from dedicated-wall dams 1216, as shown in a cross-sectional view 1210.

In step 1112, method 1100 attaches the plurality of dedicated-wall dams to a device wafer, the device wafer including a plurality of dies, each of the plurality of dies comprising a semiconductor device, to form a respective plurality of encapsulated semiconductor devices. In an example of step 1112, method 1100 bonds dedicated-wall dams 1216 to device wafer 422 with a first sealant portion 1218, to form a respective plurality of unsingulated encapsulated semiconductor devices 1212.

To ensure robustness of sealed cavities 1220, width W5 of dedicated-wall dams 1216 should exceed 20 μm. Carrier wafer 424 is aligned with device wafer 422 such that two dedicated-wall dams 1216 are between two adjacent microlens arrays 407.

In step 1114, method 1100 deposits an intra-dam sealant into each channel formed in step 1110. In an example of step 1114, method 1100 deposits an intra-dam sealant 1236 into each channel 1219, as shown in double-sealed encapsulated semiconductor devices 1214. The presence of intra-dam sealants 1236 protecting first sealant portions 1218 makes devices 1214 "double-sealed."

In a preferred embodiment of devices 1214, the location of intra-dam sealant 1236 is confined to two regions: between nearest-neighbor (adjacent) dedicated-wall dams 1216, and between nearest-neighbor first sealant portions 1218. For example, in FIG. 12, intra-dam sealants 1236 do not extend between a dam 1216 and carrier wafer 424, or between a sealant portion 1218 and device wafer 422. Intra-dam sealant 1236 may extend into these regions without departing from the scope hereof.

Intra-dam sealant 1236 protects double-sealed encapsulated semiconductor devices 1214 from moisture-related and chemical-related damage. Intra-dam sealant 1236 protects first sealant portion 1218, which allows first sealant portion 1218 to be chosen for its optimal moisture absorption and adhesive properties. Method 1100 does not require intra-dam sealant 1236 to function as an adhesive for bonding a dedicated-wall dam 1216 to either carrier wafer 424 and device wafer 422.

In optional step 1150, method 1100 singulates (dices) the encapsulated device wafer to form a plurality of encapsulated semiconductor devices. In an example of step 1150, method 1100 singulates double-sealed encapsulated wafer assembly 1214 along scribe lines 1229 to form an encapsulated semiconductor device 1250 with dedicated-wall dams 1216. Encapsulated semiconductor device 1250 also includes a device die 1252, sealant portions 1256, and a carrier layer 1254, which are singulated portions of device wafer 422, intra-dam sealant 1236, and carrier wafer 424, respectively.

The dicing cuts along double-sealed encapsulated semiconductor devices 1214 have dice kerf W6. The width of dedicated-wall dams 1216 remains W5 if kerf W6 is less than width W4, as illustrated in encapsulated semiconductor device 1250. Kerf W6 may exceed width W4 without departing from the scope hereof. In such a case, encapsulated semiconductor device 1250 does not include an intra-dam sealant 1236, as the dicing step 1150 removes it.

For proper sealing of sealed cavities 1220, intra-dam sealant 1236 should adhere well to both carrier wafer 424 and dedicated-wall dams 1216. Candidates for intra-dam sealant 1236 include epoxies EPO-TEK® 353ND (Epoxy Technology, Inc., Billerica, Mass., USA) and Emerson & Cuming Stycast® 1269A (Ellsworth Adhesives, Germantown, Wis., USA).

Figure 13:
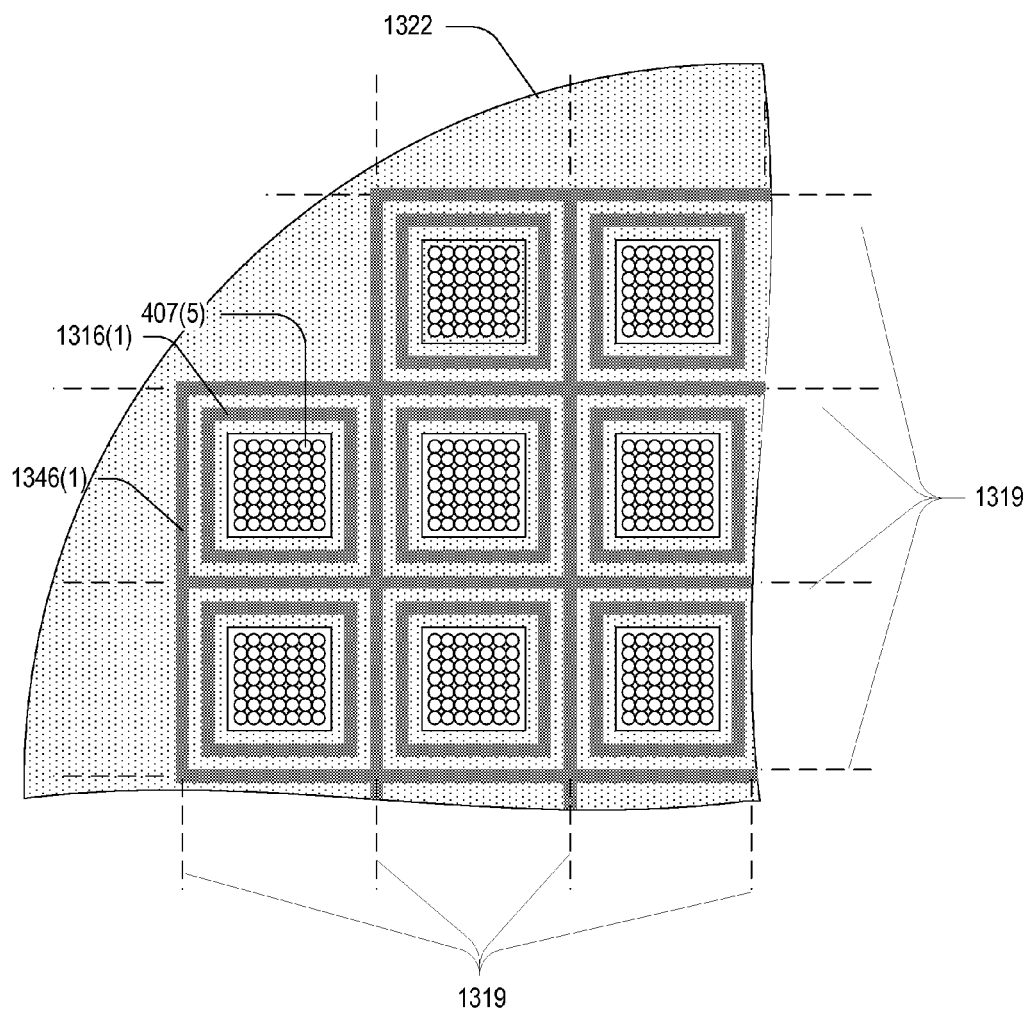
FIG. 13 is a plan view of dedicated-wall dams mounted on a carrier wafer, wherein a shared-wall dam surrounds each dedicated-wall dam, in an embodiment.

FIG. 13 is a plan view of dedicated-wall dams 1316 mounted on a wafer 1322. Each dedicated-wall dam 1316 encloses a microlens array 407. Dedicated-wall dams 1316 resemble dedicated-wall dams 1016. Unlike the dedicated-wall dams 1216, each dedicated-wall dam 1316 is surrounded by a shared-wall dam 1346. For example, a shared-wall dam 1346(1) surrounds dedicated-wall dam 1316(1), which encloses a microlens array 407(5). Whereas the midpoint between adjacent dedicated-wall dams 1016 is within a channel 1019, the midpoint between adjacent dedicated-wall dams 1316 is within a shared-wall dam 1346.

Figure 14A:
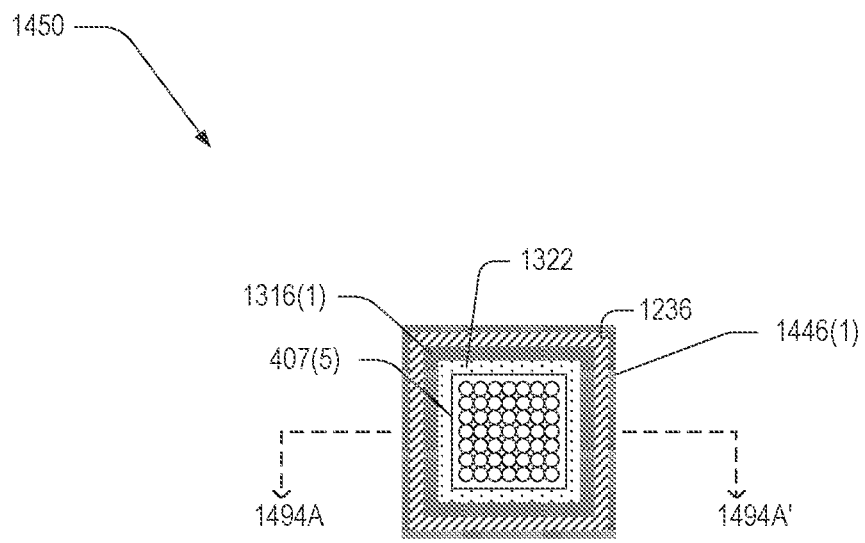
FIGS. 14A and 14B show a plan view and a cross-sectional view, respectively, of an encapsulated semiconductor device having a dedicated-wall dam and a surrounding outer-wall dam, in an embodiment.
Figure 14B:
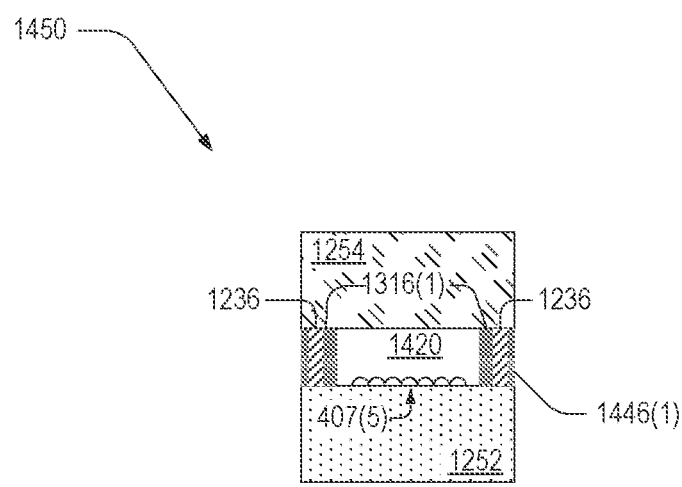

FIGS. 14A and 14B show a plan view and a cross-sectional view, respectively, of an encapsulated semiconductor device 1450 having a dedicated-wall dam and a surrounding outer-wall dam. The cross-sectional view of FIG. 14B is along a cross-section 1494A-1494A'. Encapsulated semiconductor device 1450 is similar to encapsulated semiconductor device 1250, FIG. 12, with the addition of an outer-wall dam 1446.

Encapsulated semiconductor device 1450 results from dicing wafer 1322 along dicing lines 1319, FIG. 13. Dicing lines 1319 are substantially aligned with shared-wall dams 1346 such that splits shared-wall dams 1346 to form outer-wall dam 1446. In the plan view of FIG. 14A, outer-wall dam 1446(1) forms the outer perimeter of encapsulated semiconductor device 1450, which also includes a microlens array 407(5) surrounded by a dedicated-wall dam 1316(1) and intra-dam sealant 1236. Encapsulated semiconductor device 1450 includes a sealed cavity 1420 that is similar to sealed cavity 1220 of encapsulated semiconductor device 1250.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. An encapsulated semiconductor device comprising:
    a device die with a semiconductor device fabricated thereon;
    a carrier layer opposite the device die for covering the semiconductor device;
    a dam for supporting the carrier layer above the device die, the dam being located therebetween and being formed of a dam material, the device die, the dam, and the carrier layer forming a sealed cavity enclosing the semiconductor device;
    a first sealant portion for attaching the dam to the device die, the first sealant portion being located therebetween and being formed of a material other than the dam material;
    a means for attaching the dam to the carrier layer;
    an intra-dam sealant covering dam surfaces that comprise an outer surface of the sealed cavity; and
    an outer-wall dam covering the sealant, the intra-dam sealant being between the dam surfaces and outer-wall dam;
    wherein neither the first sealant portion, nor the means for attaching the dam to the carrier layer, nor a combination thereof, independently bridge a gap between the device die and the carrier layer.

2. The semiconductor device of claim 1, the dam material being either silicon or a semiconductor carrier wafer.

3. The semiconductor device of claim 1, the means for attaching the dam to the carrier layer comprising a second sealant portion, the second sealant portion being located therebetween.

4. The semiconductor device of claim 1, the sealed cavity having a height exceeding 200 micrometers.

5. The semiconductor device of claim 1, the semiconductor device including a CMOS image sensor.

6. The semiconductor device of claim 5, the CMOS image sensor comprising a microlens array, a surface of the microlens array being a boundary between the microlens array and the sealed cavity.

7. A method of encapsulating semiconductor devices formed on a device wafer, the method comprising:
    forming an assembly including a carrier wafer and a plurality of dams thereon; and, after the step of forming,
    attaching the assembly to the device wafer to form a respective plurality of encapsulated semiconductor devices;
    each of the plurality of dams being a dedicated-wall dam and, after the step of attaching, depositing an intra-dam sealant into a plurality of channels, a channel being a region between adjacent dedicated-wall dams.

8. The method of claim 7, further comprising, after the step of attaching, singulating the device wafer to form the plurality of encapsulated semiconductor devices.

9. The method of claim 7, the step of forming comprising:
    disposing one or more first sealant portions on one or both of the carrier wafer and a spacer wafer;
    attaching the spacer wafer to the carrier wafer; and
    photolithographically patterning the spacer wafer.

10. The method of claim 9, further comprising, after the step of attaching, thinning the spacer wafer.

11. The method of claim 9, the step of photolithographically patterning comprising:
    depositing a photoresist layer on the spacer wafer;
    exposing the photoresist layer through a photomask; and
    photolithographically etching the spacer wafer to form the plurality of dams.

12. The method of claim 9, the step of attaching the assembly to the device wafer further comprising forming one or more second sealant portions on one or both of the device wafer and dam surfaces opposite the one or more first sealant portions.

13. The method of claim 7, the step of forming comprising:
    applying a first sealant on one or both of the carrier wafer and an apertured spacer wafer having a plurality of apertures; and
    bonding the apertured spacer wafer to the carrier wafer such that the carrier wafer completely covers each of the plurality of apertures.

14. The method of claim 13, further comprising forming the apertured spacer wafer that includes the plurality of apertures bounded by the plurality of dams, the apertures being at locations corresponding to respective locations of semiconductor dies formed on the device wafer.

15. The method of claim 13, the step of attaching further comprising: bonding the apertured spacer wafer to the device wafer.

* * * * *

UNITED STATES PATENT AND TRADEMARK OFFICE
CERTIFICATE OF CORRECTION

| | | |
|---|---|---|
| PATENT NO. | : 9,450,004 B2 | Page 1 of 1 |
| APPLICATION NO. | : 14/542169 | |
| DATED | : September 20, 2016 | |
| INVENTOR(S) | : Chih-Hung Tu et al. | |

It is certified that error appears in the above-identified patent and that said Letters Patent is hereby corrected as shown below:

On the Title Page

Page 2, item (56), Other Publications, Column 2, Line 2, "Semicaonductor" should read
-- Semiconductor --;

In the Specification

Column 2, Line 6, "Infuenced" should read -- "Influenced --;
Column 2, Line 8, "Micromechnics" should read -- Micromechanics --;
Column 3, Line 38, "SCHOTT A G" should read -- SCHOTT AG --.

Signed and Sealed this
Nineteenth Day of June, 2018

Andrei Iancu
*Director of the United States Patent and Trademark Office*